United States Patent
Meisenberg et al.

(10) Patent No.: US 8,803,518 B2
(45) Date of Patent: Aug. 12, 2014

(54) MEASURING APPARATUS FOR MEASURING MAGNETIC PROPERTIES, AND METHOD FOR PRODUCING SUCH A MEASURING APPARATUS

(75) Inventors: Armin Meisenberg, Dortmund (DE); Axel Bartos, Waltrop (DE)

(73) Assignee: MEAS Deutschland GmbH, Dortmund (DE)

( * ) Notice: Subject to any disclaimer, the term of this patent is extended or adjusted under 35 U.S.C. 154(b) by 625 days.

(21) Appl. No.: 13/054,537

(22) PCT Filed: Jul. 17, 2009

(86) PCT No.: PCT/EP2009/005196
§ 371 (c)(1),
(2), (4) Date: Mar. 2, 2011

(87) PCT Pub. No.: WO2010/006801
PCT Pub. Date: Jan. 21, 2010

(65) Prior Publication Data
US 2011/0148408 A1    Jun. 23, 2011

(30) Foreign Application Priority Data
Jul. 17, 2008   (DE) .......................... 10 2008 033 579

(51) Int. Cl.
*G01R 33/02*   (2006.01)
(52) U.S. Cl.
USPC ....................................................... 324/252
(58) Field of Classification Search
CPC ........... G01R 33/02; G01R 33/09; G06K 5/00
See application file for complete search history.

(56) References Cited

U.S. PATENT DOCUMENTS

| | | | |
|---|---|---|---|
| 3,341,772 A | 9/1967 | Weiss | |
| 4,079,360 A | 3/1978 | Ookubo et al. | |
| 5,157,245 A | 10/1992 | Shigeno et al. | |
| 5,180,903 A * | 1/1993 | Shigeno et al. | 235/449 |
| 5,289,122 A * | 2/1994 | Shigeno | 324/252 |

(Continued)

FOREIGN PATENT DOCUMENTS

| | | |
|---|---|---|
| CH | 421 288 | 3/1967 |
| CN | 1503001 A | 6/2004 |

(Continued)

OTHER PUBLICATIONS

International Search Report dated Nov. 13, 2009 for related PCT Application No. PCT/EP2009/005196.

(Continued)

*Primary Examiner* — Arleen M Vazquez
*Assistant Examiner* — Hoang X Nguyen
(74) *Attorney, Agent, or Firm* — Howard IP Law Group, PC

(57) ABSTRACT

Measuring apparatus for measuring magnetic properties of the area surrounding the measuring apparatus with a sensor row comprising at least two magnetoresistive sensor elements, which are arranged in a row that extends in a row direction, and a supporting field apparatus with generates a magnetic supporting field having a magnetic field component which points in the row direction and the field strength of which varies in the row direction, wherein this field strength profile in the row direction does not have a zero crossing and/or a maximum or minimum on at least two sensor edges of the sensor elements which for the sensor row, which sensor edges are arranged after one another in the row direction.

23 Claims, 5 Drawing Sheets

(56) References Cited

U.S. PATENT DOCUMENTS

| | | | |
|---|---|---|---|
| 5,512,822 A * | 4/1996 | Masuda | 324/235 |
| 5,739,517 A * | 4/1998 | Hoshino et al. | 235/449 |
| 5,896,030 A | 4/1999 | Hasken | |
| 6,690,159 B2 | 2/2004 | Burreson et al. | |
| 6,891,367 B2 * | 5/2005 | Shinmura et al. | 324/252 |
| 6,940,701 B2 | 9/2005 | Oohashi et al. | |
| 7,075,395 B2 | 7/2006 | Oohashi et al. | |
| 7,157,905 B1 | 1/2007 | Minamitani et al. | |
| 7,167,345 B2 | 1/2007 | Oohashi et al. | |
| 7,598,835 B2 | 10/2009 | Oohashi et al. | |
| 2006/0279280 A1 * | 12/2006 | Minamitani et al. | 324/252 |

FOREIGN PATENT DOCUMENTS

| | | | |
|---|---|---|---|
| CN | 1922504 A | 2/2007 | |
| EP | 1701176 A1 | 9/2006 | |
| EP | 1729142 A1 | 12/2006 | |
| JP | 58211158 A | 2/1983 | |
| JP | H0285982 A | 3/1990 | |
| JP | 5332703 A | 12/1993 | |
| JP | 2000088941 A | 3/2000 | |
| JP | 2003107142 A | 4/2003 | |
| WO | 2005083457 A1 | 9/2005 | |

OTHER PUBLICATIONS

German Office Action dated Sep. 25, 2012 in counterpart German application No. 10 2008 033 579.7.

Chinese Office Action dated Dec. 10, 2012 in counterpart Chinese application No. 200980128084.4.

* cited by examiner

MEASURING APPARATUS FOR MEASURING MAGNETIC PROPERTIES, AND METHOD FOR PRODUCING SUCH A MEASURING APPARATUS

CROSS REFERENCE TO RELATED APPLICATIONS

This application is a national stage application under 35 U.S.C. §371 of the International Application No. PCT/EP2009/005196, filed Jul. 17, 2009, and claims the benefit of German Application No. 10 2008 033 579.7, filed Jul. 17, 2008, the entire disclosures of which are incorporated herein by reference.

FIELD OF THE INVENTION

The present invention pertains to a measuring apparatus for measuring magnetic properties of the area surrounding the measuring apparatus as well as to a method for producing such a measuring apparatus.

BACKGROUND

Measuring apparatuses for identifying banknotes with magnetic patterns printed on them are known from the state of the art. Such a measuring apparatus is described, for example, in EP 1 729 142 A1. The drawback of the measuring apparatus described there is a measuring inaccuracy, which occurs when the magnetic pattern to be determined is guided over a gap in the sensor row provided there. The prior-art measuring apparatus has a low measuring accuracy in the area of its gaps between the individual sensor elements of the sensor row.

SUMMARY

Against this background, the object of the present invention was to propose a measuring apparatus for measuring magnetic properties of the area surrounding the measuring apparatus, with which these magnetic properties of the area surrounding the measuring apparatus can be measured more precisely. Furthermore, it was an object of the present invention to propose a method for producing such a measuring apparatus.

The present invention is based on the basic idea of providing the measuring apparatus with a supporting field apparatus, which generates a magnetic supporting field, which has a magnetic field component pointing in the row direction, whose field strength varies in the sensor row in the row direction. It was recognized that sensor rows have gaps between the individual sensor elements for manufacturing reasons and that it is advantageous to increase the sensitivity of the respective sensor element in the area of its edge. This makes it possible to measure magnetic properties in a gap between the edges of two sensor elements more accurately.

It was found that a supporting field apparatus, in which the magnetic field component of the magnetic support field, which component points in the row direction, has a field strength profile in the row direction, which has no zero crossing and/or no maximum or minimum on at least two sensor edges of the sensor elements which form the sensor row, which said sensor edges are arranged one after another in the row direction, is suitable for this.

It was recognized that the sensitivity of a sensor element increases at its edge if the field strength profile of the magnetic field component of the magnetic support field, which said component points in the row direction, has a zero crossing near the sensor edge of the sensor element. It may be disadvantageous for the sensitivity of the sensor element if the field strength profile of the magnetic field component of the magnetic supporting field, which said magnetic field component points in the row direction, has a maximum or minimum at the sensor edge of the sensor element. To gain the advantages of the present invention, it is sufficient if the field strength profile of the magnetic field component of the magnetic supporting field, which said magnetic field component points in the row direction, does not have a zero crossing on at least two sensor edges of the sensor elements forming which form the sensor row, which said sensor edges are arranged one after another in the row direction. It is likewise sufficient for gaining the advantages of the present invention if the field strength profile of the magnetic field component of the magnetic supporting field, which said magnetic field component points in the row direction, has no maximum or minimum on at least two sensor edges of the sensor elements which form the sensor row, which said sensor edges are arranged one after another in the row direction. In a preferred embodiment, the field strength profile of the magnetic field component of the magnetic supporting field, which said magnetic field component points in the row direction, has neither a zero crossing on at least two sensor edges of the sensor elements which form the sensor row, which said sensor edges are arranged one after another in the row direction, nor a maximum or a minimum on these sensor edges of the sensor elements which form the sensor row, which said sensor edges are arranged one after another in the row direction.

In a preferred embodiment, the field strength profile of the magnetic field component of the magnetic supporting field, which said magnetic field component points in the row direction, has no zero crossing in the entire area of a sensor element.

The sensor row of the measuring device has at least two magnetoresistive sensor elements arranged in a row. The length of the sensor row and hence the number of magnetoresistive sensor elements used depend on the measurement to be performed. To measure a euro banknote, a sensor row may have, for example, more than 10, especially preferably more than 20, for example, 28 sensor elements. To form the sensor row, the sensor elements are arranged in one row. The longitudinal central axes of all sensor elements are especially preferably located in one row. However, it is also conceivable that the sensor elements of an individual line are arranged differently in relation to an axis pointing in the row direction, so that the longitudinal central axes of the individual sensor elements do not lie in one line any longer. However, sensor elements thus arranged are especially preferably arranged such that the individual sensor elements partly overlap each other.

A plurality of sensor elements are combined into an assembly unit in a preferred embodiment, for example, arranged on a common carrier structure. Such an assembly unit will hereinafter be called a sensor. A sensor may have, for example, 2, 3, 4 or more sensor elements. However, it is also possible that a sensor is formed by a single sensor element.

In a preferred embodiment, the sensor, on which the sensor element or sensor elements is/are arranged, is designed as a chip. The chip may then be arranged on a board ("board") of the measuring apparatus. A plurality of, especially four, sensor elements are especially preferably arranged on a chip. The sensor elements are arranged on the chip preferably equidistantly from each other and from the edges of the chip. The chip may be directly connected to the board, for example, by means of a so-called "chip-on-board" or "flip chip" technology. As an alternative, the sensor may have a housing for the chip, especially preferably a plastic housing, which is electrically and mechanically connected to the board by means of the surface-mount technology.

The sensor elements are arranged in the row direction in a preferred embodiment. In an especially preferred embodiment, the distance between a first sensor element and an adjacent sensor element relative to the distance between the centers of the two sensor elements is between 1 mm and 10 mm, preferably between 2 mm and 5 mm and especially preferably 3.5 mm. In an especially preferred embodiment, a chip has two sensor elements arranged one after another in the row direction and has—without the housing—a length of 1.5 mm to 9 mm, preferably 2 mm to 3 mm and especially preferably 2.5 mm in the row direction. In a preferred embodiment, the distance from one edge of a chip to the edge of the adjacent chip is less than 1.5 mm and especially preferably less than 1.1 mm.

In an alternative embodiment, the sensor elements are arranged such that the distance between two edges of two adjacent sensor elements, which are arranged on one chip, is shorter than the distance between two edges of adjacent sensor elements, which are not arranged on one chip. The distance between two chips is predetermined, as a rule, by the technology by which a chip can be connected on a board. These technologies usually require more space than the space that is needed to arrange two magnetoresistive sensor elements on one chip. The sensitivity of the measuring apparatus can therefore be increased by arranging the sensor elements on the chip as well as the chips on the board as close to one another as possible according to the particular technology being employed.

The sensor elements are manufactured on the chips preferably according to the methods of planar technology, semiconductor technology or microsystems technology.

The sensor elements in the sensor row are magnetoresistive sensor elements. In particular, the sensor element may have the "anisotropic" magnetoresistive effect (AMR) or the "giant" magnetoresistive effect (GMR). The sensor element may, however, also have other effects, for example, giant magnetoimpedance (GMI), tunnel magnetoresistance effect (TMR) or Hall effect.

The measuring apparatus according to the present invention may be used to measure magnetic properties of the area surrounding the measuring apparatus. Magnetic properties of the area surrounding the measuring apparatus are defined especially as the magnetic field strength of a magnetic field in the area surrounding the measuring apparatus, the field direction of a magnetic field in the area surrounding the measuring apparatus, or, for example, also the change in the field strength or in the field direction of a magnetic field in the area surrounding the measuring apparatus. For example, the magnetic property is defined as the change in the field strength and in the field direction of the magnetic field surrounding the measuring apparatus when this field changes due to superimposition of a field, which is generated by a magnetic pattern of a banknote. In a preferred embodiment, the sensor row is embodied such that it detects only changes in space and/or time in the magnetic properties of the area surrounding the measuring apparatus.

The supporting field apparatus used according to the present invention may comprise one or more components, especially permanent magnets. However, the supporting field apparatus may also comprise a plurality of components, as they are necessary, for example, when generating magnetic fields by means of electromagnetic coils.

In a preferred embodiment, the supporting field apparatus generates a supporting field, whose magnetic field component pointing in the row direction has a field strength profile that has a minimum between at least two sensor elements of the sensor elements forming the sensor row. In an especially preferred embodiment, in which at least two chips with two sensor elements each arranged on the chips are provided, the supporting field apparatus generates a supporting field, whose magnetic field component pointing in the row direction has a field strength profile in the row direction that has a zero crossing between the chips and a maximum or a minimum between the sensor elements of one chip.

In a preferred embodiment, a supporting field apparatus is provided, which generates essentially only a field acting in the sensor element. Such an embodiment may be advantageous for detecting hard magnetic materials. A supporting field apparatus is used especially preferably, in which the magnetic field component pointing at right angles to the plane of the sensor elements has a field strength profile that rapidly decreases after the sensor elements in the direction from the supporting field apparatus to the sensor elements and it has, for example, a value of approx. 50% of its maximum field strength above the sensor element surface pointing in this direction at a distance of 2 mm from the sensor surface in this direction. By passing a measured object with hard magnets over such a measuring apparatus, the field of the hard magnets of the measured object is superimposed to this supporting field. The change in the overall magnetic field present at the sensor elements, which is associated with the superimposition, can be detected by the sensor elements.

A supporting field apparatus, which generates a field, which acts far beyond the sensor element and makes it possible to detect both hard and soft magnetic materials, is provided in a preferred embodiment. A supporting field apparatus that is used especially preferably is one in which the magnetic field component pointing at right angles to the plane of the sensor elements has a field strength profile that decreases only slightly after the sensor elements in the direction pointing from the supporting field apparatus to the sensor elements and has, for example, a value of 80% of its maximum field strength above the sensor element surface pointing in this direction at a distance of 2 mm from the sensor surface in this direction. By passing a measured object containing hard as well as soft magnetic materials over such a measuring apparatus, the supporting field is deformed by the presence of such materials. This deformation of the magnetic field present can be detected by the sensor elements to generate a sensor signal. The supporting field especially preferably has, in the area of the measuring apparatus, in which the measured object is arranged during the measurement, a magnetic field strength that is markedly higher, preferably by at least 3 times, than the coercive field strength of the magnetic structures to be detected.

The improvement of the measuring accuracy is already achieved if the field strength profile has no zero crossing and/or no maximum or minimum on at least two sensor edges arranged one after another in the row direction. These sensor edges arranged one after another in the row direction do not have to directly follow each other. The success of the present invention is also achieved if the field strength profile has no zero crossing and/or no maximum or minimum on any desired edge of any desired first sensor element of the sensor row and on any desired edge of any desired second sensor element of the sensor row in the row direction as long as the edges in question are edges that are arranged one after another over the entire extension of the sensor row in the row direction.

Provisions may be made in an embodiment of the measuring apparatus according to the present invention for the field strength profile to have a zero crossing and/or a maximum or minimum on a sensor edge of the sensor elements that form the sensor row in the row direction. The advantages according to the present invention are now gained on other edges of the sensor element.

A supporting field, in which the field strength profile has no zero crossing and/or no maximum or minimum on all sensor edges of the sensor elements that form the sensor row, which said sensor edges are arranged one after another in the row direction, is generated in an especially preferred embodiment of the measuring apparatus according to the present invention. For example, the supporting field is generated by one magnet per sensor element each. This magnet may be arranged directly on the sensor in the simplest case during the manufacture of the sensor element.

The supporting field may be imposed in a time-variant manner, for example, in a pulse-like manner. However, the supporting field is time-invariant in a preferred embodiment and is always present in the same manner. This simplifies especially the design of the measuring apparatus, because permanent magnets can be used to generate the supporting field.

In a preferred embodiment, the field strength profile is periodic in the row direction and has an integral multiple or an integral fraction of the period of the preferably constant distance between the sensor elements of the sensor row in an especially preferred embodiment. In an especially preferred embodiment, the supporting field apparatus has arrays of magnets at the beginning and at the end of the sensor row, which arrays also lead to an essentially periodic pattern of the field strength in the row direction over the sensor row. This can be achieved by the magnet array having preferably at least 3 more poles projecting beyond the end of the sensor row. In a preferred embodiment, the edge effects are reduced to shorten the overall length by a modification of the geometry or magnetization or arrangement of the outer magnets, for example, by shortening the length of the magnet by approx. 30% of the magnet period.

In a preferred embodiment, the supporting field apparatus has a row of magnets arranged next to each other, especially arranged next to each other in the row direction of the sensor elements. The magnetization of the magnets of this row may be alternating, so that the magnetization of one magnet is opposite the magnetization of the magnet located adjacent to it. The magnets arranged next to each other in a row may, however, also have the same magnetization. The magnets are arranged in this case especially preferably at spaced locations from each other in the row direction. However, the magnets arranged next to each other in a row may also have alternating magnetizations, which strengthen the sensor element-side field and weaken the rear-side field.

The magnets are arranged directly adjacent to each other in a preferred embodiment, especially with magnets arranged next to each other in the row direction, in which the magnetization of the magnets alternates from one magnet to the adjacent magnet. This leads to a homogeneous profile of the supporting field.

The supporting field apparatus may be manufactured especially preferably from plastic-bound hard ferrite or from rare earth magnets.

In a preferred embodiment, the supporting field apparatus with a row of magnets arranged next to each other, in which the magnetization alternates, is arranged in relation to the sensor row such that the transition from one magnet to the adjacent magnet is arranged in the middle of at least one sensor element, relative to the extension thereof in the row direction. It is achieved as a result in a simple manner that the field strength profile has no zero crossing and/or no maximum or minimum in the row direction on sensor edges of the sensor elements forming the sensor row, which said sensor edges are arranged one after another.

The supporting field apparatus has permanent magnets in a preferred embodiment. The supporting field function can be built up as a result in a simple manner.

In a preferred embodiment, the measuring apparatus may have two sensor rows arranged next to each other, for example, two sensor rows arranged next to each other in a measuring direction, in which the measured object to be measured is possibly moved. The measuring accuracy can be further increased hereby. In addition or as an alternative, the measuring apparatus may have two supporting field apparatuses arranged next to each other. The field pattern of the supporting field can be homogenized hereby. The limited extension in space of the supporting field magnets may lead, especially when using gradient sensors that are extensive in space, to undesired sensor properties, for example, sensitivity fluctuations. To avoid these drawbacks, homogenization of the supporting field at right angles to the row direction is achieved in a preferred embodiment by the use of at least one more spaced array of supporting magnets.

Two sensor cells arranged in the row direction one after another, which are used to determine different properties, are provided in an especially preferred embodiment. It is known that banknotes have so-called hard magnetic and soft magnetic patterns. To recognize the hard magnetic patterns, it is necessary to premagnetize the banknote. A strong supporting field is necessary to recognize the soft magnetic patterns. The simultaneous recognition of the hard magnetic patterns and the soft magnetic patterns can be carried out by the supporting field of a first sensor row, over which the banknote is first passed. Consequently, the supporting field of this row makes it possible to recognize the soft magnetic patterns and is used at the same time to premagnetize the hard magnetic structures. If the banknote is subsequently passed over a second sensor row, this second sensor row can separately recognize the hard magnetic pattern. Both the first sensor row and the second sensor row have supporting field apparatuses in a preferred embodiment. The advantage of the separate recognition of soft magnetic and hard magnetic structures is the improved checking for authenticity. The use of a separate premagnetizing magnet can be eliminated at the same time.

In a preferred embodiment, the measuring apparatus according to the present invention has a premagnetizing magnet, which is arranged in front of the sensor row. Magnetization of a measured object with hard magnetic pattern can be carried out with this premagnetizing magnet over which the measured object is at first passed. If the measured object is subsequently passed over a sensor row, this sensor row can recognize the hard magnetic pattern. The premagnetizing magnet is designed in a preferred embodiment such that it generates a magnetic field, which has essentially only a direction pointing at right angles to the plane of the sensor elements, in at least one sensor element and preferably in all sensor elements. The field of the premagnetizing magnet can be prevented hereby from affecting the sensitivity of the sensor elements.

The measuring apparatus has no premagnetizing magnets in an especially preferred embodiment. Magnetization of the measured object can be achieved with such a measuring apparatus, for example, by the supporting field having a magnetic field strength that is markedly higher than the coercive field strength of the magnetic structures to be detected in the area of the measuring apparatus, in which area the measured object is arranged during the measurement.

The apparatus according to the present invention may be integrated in a housing together with a preamplifier. In addition or as an alternative, the housing may have arrangements against abrasion or the like.

The method according to the present invention for manufacturing the measuring apparatus according to the present invention provides for a supporting field apparatus being aligned with a row of magnets arranged next to each other relative to the sensor row. An electric conductor is arranged for this in the area of the sensor row. The electric conductor is designed such that when a current flows through it, it generates a field, which generates in the sensor row a signal that is dependent on the position of the supporting field apparatus and independent, in a first approximation, from the position of the sensor row relative to the electric conductor. It can thus be recognized on the basis of this signal whether the supporting field apparatus is arranged in the desired position relative to the sensor row. It is also possible to check the sensitivity of the individual sensor elements by means of such an apparatus.

The measuring apparatus according to the present invention may be used in pattern recognition on documents of value, for example, banknotes, checks, which are often provided with a soft magnetic and/or hard magnetic pattern. The measuring apparatus according to the present invention may also be used to recognize so-called tags or to recognize magnetic bar codes. The measuring apparatus according to the present invention may also be used for testing materials, for example, to detect defects, holes or cracks. The measuring apparatus according to the present invention may also be used in magnetic arrays in biochips of the so-called "lab-on-a-chip" technology, for example, to detect magnetic beads or to homogenize the sensitivity distribution of the array.

BRIEF DESCRIPTION OF THE DRAWINGS

The present invention will be explained in more detail below on the basis of a drawing representing an exemplary embodiment only. In the drawings.

DETAILED DESCRIPTION

The measuring apparatus according to the present invention for measuring magnetic properties in the area surrounding the measuring apparatus has magnetoresistive sensor elements 1 arranged next to each other. The sensor elements 1 are arranged in two rows 4a, 4b arranged in parallel to each other. A plurality of magnetoresistive sensor elements 1 are integrated on one sensor chip 2. The sensor chip 2 forms with a housing a sensor 3, which is arranged on a board of the measuring apparatus, not shown in more detail.

Figure 1:
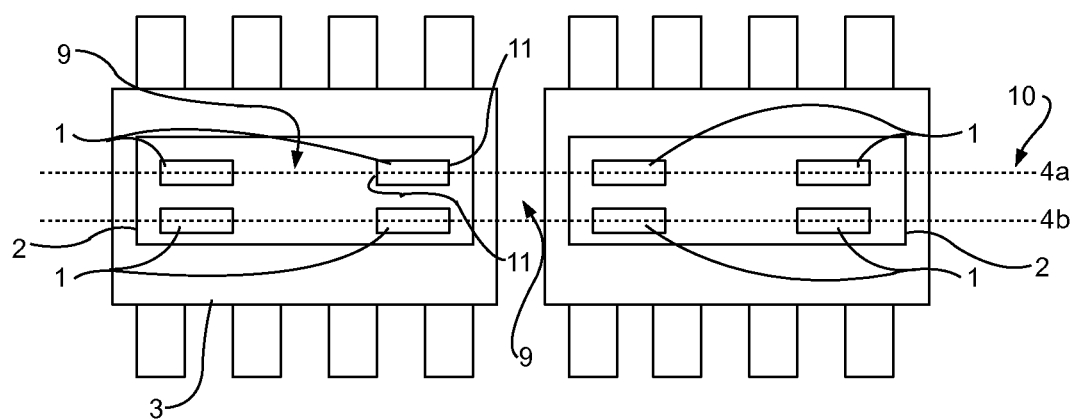
FIG. 1 shows a schematic top view of a measuring apparatus according to the present invention.

In the view according to FIG. 1, the measuring apparatus according to the present invention has at least two chips 2 arranged next to each other. The chips 2 are arranged next to each other such that the distances 9 between all sensor elements 1 in one sensor row 4a, 4b are equal.

The length of the sensor row and hence the row of magnetoresistive sensor elements 1 depends on the measurement to be performed. The number of sensor chips 2 used depends, in particular, on the measurement task, i.e., essentially the width of the object to be measured and the size of the sensor chip 2. A sensor row may have, for example, more than 10, especially preferably more than 20 and above all 28 sensor elements 1 for measuring euro banknotes.

Figure 2:
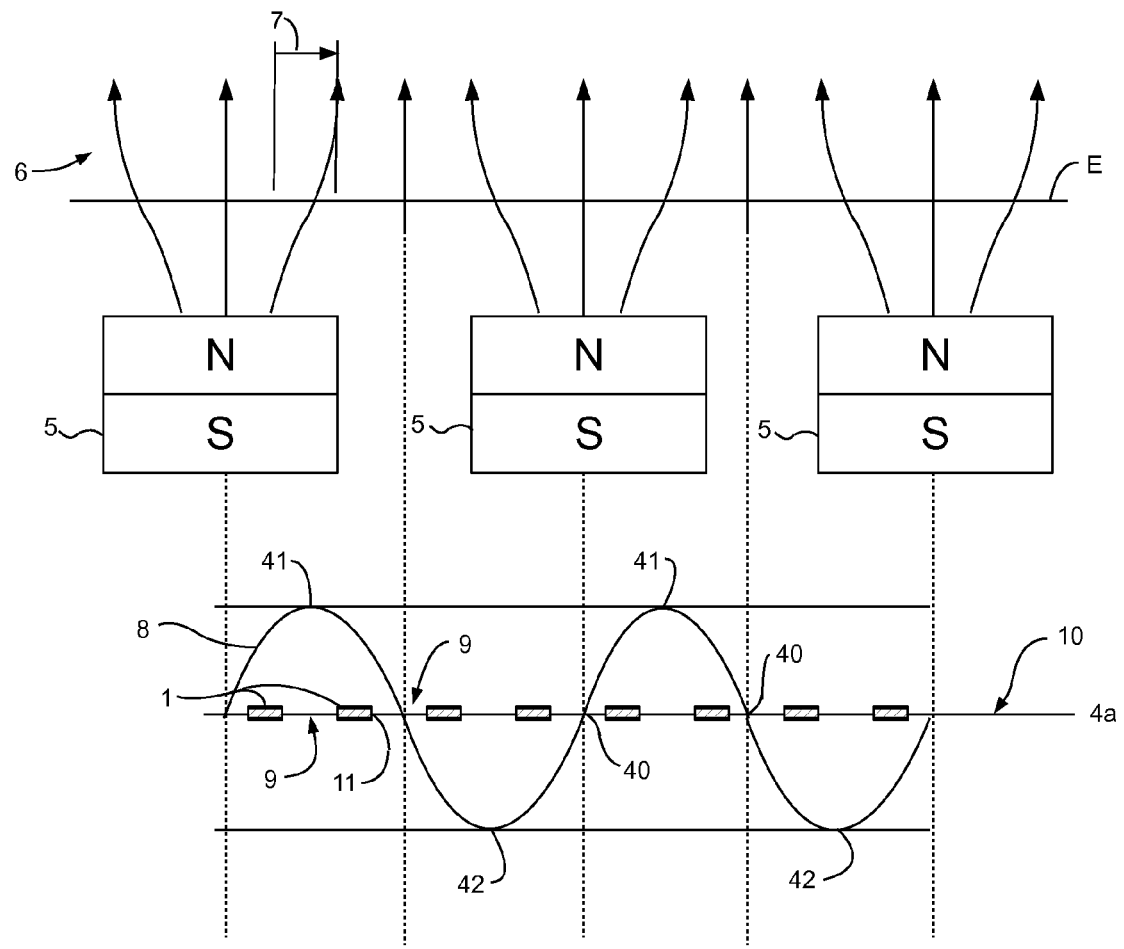
FIG. 2 shows a schematic side view of the design of a supporting field apparatus of a measuring apparatus according to the present invention, in which a far-reaching supporting field is generated.
Figure 3:
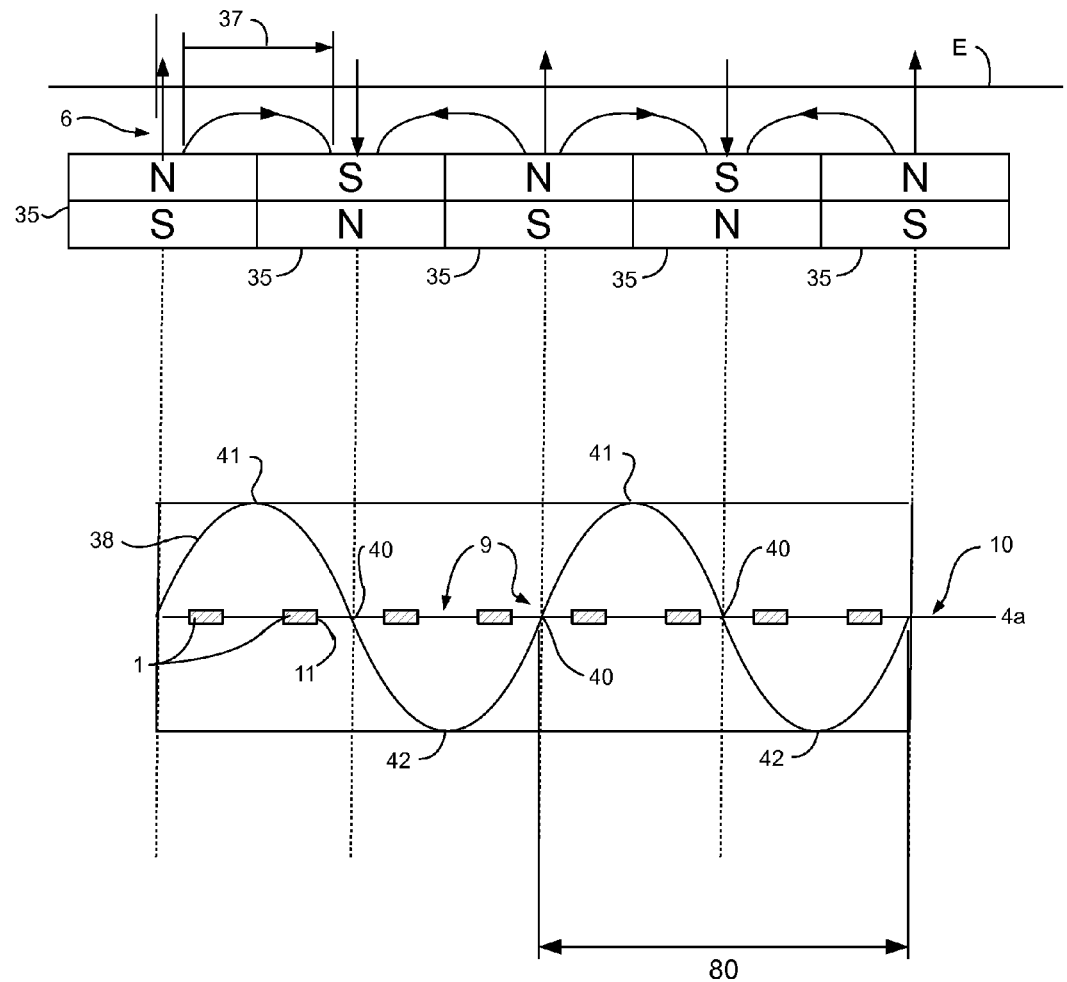
FIG. 3 shows a schematic side view of the design of a supporting field apparatus of a measuring apparatus according to the present invention, in which a supporting field limited locally to the sensor element is generated.
Figure 4:
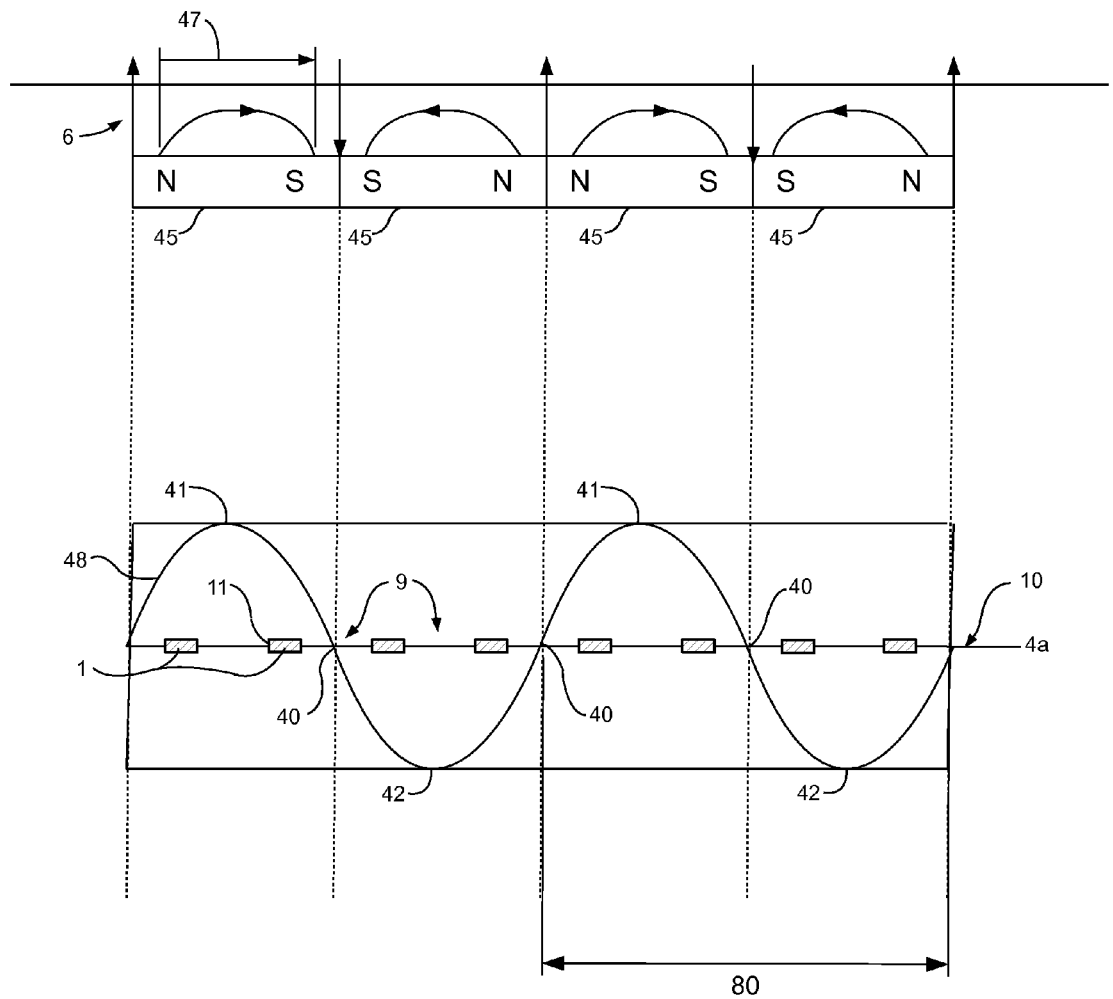
FIG. 4 shows a schematic side view of the design of a supporting field apparatus of a measuring apparatus according to the present invention, in which a supporting field limited locally to the sensor element is generated.

FIGS. 2 through 4 show possible structural shapes of a supporting field apparatus, with which a magnetic field can be generated, which has a magnetic field component pointing in the row direction 10, whose field strength varies in the sensor row in the row direction 10. Line E in FIGS. 2 through 4 symbolizes the plane extending at right angles to the plane of the paper, in which the sensor elements 1 are arranged. The sensor elements 1, not shown more specifically in plane E, form a sensor row 4a, which extends from right to left.

The supporting field apparatus is formed by a plurality of magnets 5, which are arranged below plane E in the embodiments shown in FIGS. 2 through 4, below in reference to the area surrounding the measuring apparatus, in which the measured object is located during the measurement (this area is located above plane E in the views in FIGS. 2 through 4 and for the exemplary embodiment shown in FIGS. 2 through 4).

The magnets 5 are directed in the same way in the embodiment shown in FIG. 2. The respective north poles of the magnets point upwards. As can be determined from the field lines 6 shown in FIG. 2, the supporting field expands upwardly, among other things, from the poles. It is directed at right angles upwardly in the middle of the respective pole. Based on the symmetry of the arrangement, the supporting field is in turn directed upwards on the center line between two magnets 5, while it has a direction deviating from the vertically upwardly pointing direction between the middle of the pole and the center line between two magnets 5 and hence a magnetic field component 7 pointing in the row direction, whose field strength is different from zero. The pattern of this magnetic field component pointing in the row direction is shown in the graph 8 contained in FIG. 2. The positions of the sensor elements symbolically indicated as rectangles 1 are shown in this graph for better orientation.

The magnets 35 are directed alternatingly in the embodiment shown in FIG. 3. As can be determined from the field lines shown in FIG. 3, the supporting field expands vertically upwardly in the middle of the respective pole. The supporting field expands in the manner shown in FIG. 3 between the middle of the respective pole and the middle of the respective adjacent pole. The supporting field thus has a magnetic field component 37 pointing in the row direction, whose field strength is different from zero. The pattern of this magnetic field component pointing in the row direction is shown in the graph 38 contained in FIG. 3.

The magnets 45 are directed alternatingly in the embodiment shown in FIG. 4. As can be determined from the field lines shown in FIG. 4, the supporting field expands vertically upwardly on the side of the respective pole. The supporting field expands in the manner shown in FIG. 4 between this side of the respective pole and the other side of the respective magnet 45. The supporting field thus has a magnetic field component 47 pointing in the row direction, whose field strength is different from zero. The pattern of this magnetic field component pointing in the row direction 10 is shown in the graph 48 contained in FIG. 4.

As can be determined from the graphs 8, 38, 48 contained in FIGS. 2 through 4, the supporting field apparatus generates a periodic magnetic supporting field 80 varying in the row direction 10 in the area of the sensor row 4a, 4b. It is recognized that the field strength pattern has neither a zero crossing 40 nor a maximum 41 or minimum 42 in the row direction in the area of the edges 11 of the sensor elements 1. In the embodiment shown in FIGS. 2 through 4, the field strength pattern 8 has a maximum 41 or a minimum 42 in the middle of a sensor chip and a zero crossing 41 between two sensor chips.

Figure 5:
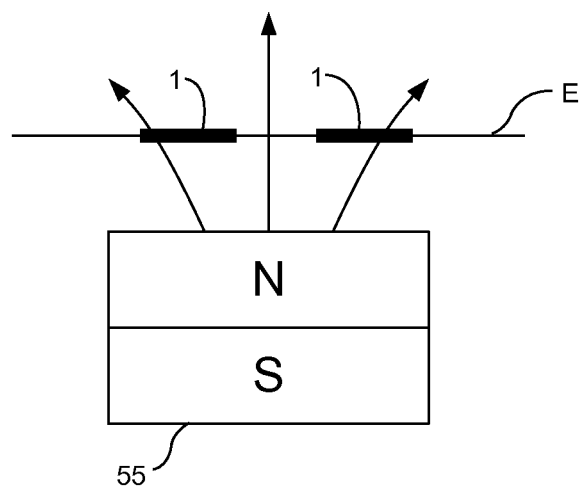
FIG. 5 shows a sectional view of a supporting field apparatus, in which a divergent field pattern of a one-row array of supporting field magnets is shown in the area of two sensor elements.
Figure 6:
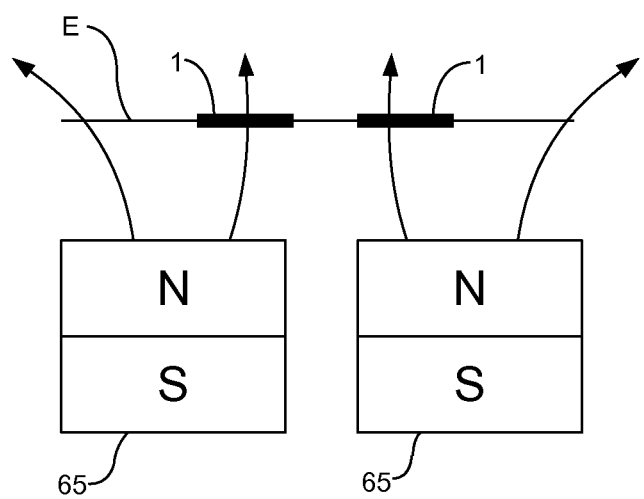
FIG. 6 shows a sectional view of an array with two supporting field apparatuses, in which a homogeneous, parallel field pattern of a two-row array of supporting field magnets is shown in the area of two sensor elements.

FIGS. 5 and 6 show how a homogeneous field can be generated by arranging two rows of supporting field magnets 55, 65 in parallel in the sensor row. The supporting field apparatus shown in FIG. 5 comprises a row of individual supporting field magnets 55, wherein the row of magnets 55 extends at right angles to the plane of the sheet in the view shown in FIG. 5. The structural shape shown in FIGS. 5 and 6 has two sensor rows arranged in parallel next to each other, which extend at right angles to the plane of the sheet. It is recognized from the field lines shown in FIG. 5 that in the sensor elements shown, the supporting field has a field component in the plane of the sensor rows, which points to the right and to the left in the view shown in FIG. 5. According to the preferred embodiment shown in FIG. 6, two supporting field apparatuses 65 are provided, which are directed in parallel to one another. It is recognized from the field lines shown in FIG. 6 that the supporting field has essentially only one field component at right angles to the plane of the sensor elements 1 in the plane of the sensor rows in the sensor elements 1 shown.

What is claimed is:

1. Measuring apparatus for measuring magnetic properties of the area surrounding the measuring apparatus with a sensor row comprising:
   at least two magnetoresistive sensor elements arranged in a row extending in a row direction, and
   a supporting field apparatus, which generates a magnetic supporting field, which has a magnetic field component pointing in the row direction and a field strength which varies in the row direction,
   wherein the supporting field apparatus is arranged relative to the at least two sensor elements such that the field strength defines a profile having one or more zero crossings, one or more maxima and one or more minima and wherein all of said one or more zero crossings, all of said one or more maxima and all of said one or more minima are located at positions along the row direction that do not correspond to a location of any one of said at least two sensor elements.

2. Measuring apparatus in accordance with claim 1, wherein the field strength profile has at least one of no zero crossing and no maximum or minimum in the row direction on a sensor edge of the at least two sensor elements which form a sensor row, the sensor edge being transverse to the row direction.

3. Measuring apparatus in accordance with claim 1, wherein the magnetic supporting field is time-invariant.

4. Measuring apparatus in accordance with claim 1, wherein the field strength profile has at least two maxima and one minimum in the row direction.

5. Measuring apparatus in accordance with claim 1, wherein the field strength profile is periodic in the row direction in the area of the row.

6. Measuring apparatus in accordance with claim 1, wherein the supporting field apparatus has a row of magnets arranged next to each other, wherein the magnetization of one magnet is opposite the magnetization of the magnets located adjacent to it.

7. Measuring apparatus in accordance with claim 1, wherein the supporting field apparatus has a row of magnets arranged next to each other, wherein the magnetization of one magnet is parallel to the magnetization of the magnets located adjacent to it.

8. Measuring apparatus in accordance with claim 6, wherein the magnets directly adjoin each other.

9. Measuring apparatus in accordance with claim 6, wherein the row of magnets arranged next to each other is arranged relative to the sensor row such that the transition from one magnet to the adjacent magnet is not arranged in the middle of at least one sensor element of the at least two sensor elements relative to the extension thereof in the row direction.

10. Measuring apparatus in accordance with claim 1, wherein a single magnet with locally varying magnetization distribution is used.

11. Measuring apparatus in accordance with claim 1, wherein the supporting field apparatus has permanent magnets.

12. Measuring apparatus in accordance with claim 1, wherein the at least two magnetoresistive sensor elements are arranged in at least two sensor rows arranged next to each other.

13. Measuring apparatus in accordance with claim 1, wherein the supporting field apparatus comprises at least two rows of magnets arranged next to each other.

14. Measuring apparatus in accordance with claim 1, wherein the at least two magnetoresistive sensor elements are arranged in at least two sensor rows arranged one after another.

15. Measuring apparatus in accordance with claim 1, wherein the sensor elements are arranged such that sensor signals generated by the at least two sensor elements are determined by local field gradients generated in the short range of the at least two sensor elements, but not by homogeneous fields.

16. Measuring apparatus in accordance with claim 1, wherein the field strength profile is generated in the row direction at least one sensor element of the at least two sensor elements by a magnet, which is arranged directly on a chip, on which the at least one sensor element is arranged.

17. Method of assembling a measuring apparatus, comprising the steps of:
   arranging at least two magnetoresistive sensor elements in a row defining a row direction;
   providing a supporting field apparatus, wherein the supporting field apparatus generates a magnetic supporting field having a magnetic field along the row direction and the magnetic field having a varying field strength along the row direction, the magnetic field having a profile including one or more zero-crossings, one or more maxima and one or more minima; and
   arranging the supporting field apparatus and the at least two magnetoresistive elements such that all of said one or more zero crossings, all of said one or more maxima and all of said one or more minima of the magnetic field profile are located at positions along the row direction that do not correspond to a location of any one of said at least two magnetoresistive sensor elements.

18. Measuring apparatus in accordance with claim 7, wherein the magnets directly adjoin each other.

19. Measuring apparatus in accordance with claim 7, wherein the row of magnets arranged next to each other is arranged relative to the sensor row such that the transition from one magnet to the adjacent magnet is not arranged in the middle of at least one sensor element of the at least two sensor elements relative to the extension thereof in the row direction.

20. A measuring apparatus for measuring magnetic properties comprising:
- at least two magnetoresistive sensor elements arranged in a row extending in a row direction, and
- at least one row of magnets, arranged parallel to the row direction and arranged relative to the at least two magnetoresistive sensor elements to generate a magnetic supporting field, the magnetic supporting field having a magnetic field component in the row direction and a magnetic field strength varying in the row direction,
- wherein the magnetic field strength in the row direction defines a profile having one or more zero crossings, one or more maxima and one or more minima and wherein all of said one or more zero crossings, all of said one or more maxima and all of said one or more minima are located at positions along the row direction that do not correspond to a location of any one of the at least two sensor elements.

21. The measuring apparatus of claim 20, wherein said at least one row of magnets comprises a plurality of magnets having poles arranged perpendicular to the row direction and having parallel directions of polarity.

22. The measuring apparatus of claim 20, wherein said at least one row of magnets comprises a plurality of magnets having poles arranged perpendicular to the row direction and having a direction of polarity alternating in the row direction.

23. The measuring apparatus of claim 20, wherein said at least one row of magnets comprises a plurality of magnets having poles arranged along the row direction and having a direction of polarity alternating in the row direction.

* * * * *